(12) United States Patent  
Gates

(10) Patent No.: US 6,184,488 B1
(45) Date of Patent: Feb. 6, 2001

(54) LOW INDUCTANCE LARGE AREA COIL FOR AN INDUCTIVELY COUPLED PLASMA SOURCE

(75) Inventor: Duane Charles Gates, Danville, CA (US)

(73) Assignee: Lam Research Corporation, Fremont, CA (US)

( * ) Notice: Under 35 U.S.C. 154(b), the term of this patent shall be extended for 0 days.

(21) Appl. No.: 09/064,092

(22) Filed: Apr. 22, 1998

Related U.S. Application Data

(63) Continuation of application No. 08/491,342, filed on Jun. 30, 1995, now Pat. No. 5,874,704.

(51) Int. Cl.[7] .................................................. B23K 10/00
(52) U.S. Cl. ............................ 219/121.43; 219/121.57; 219/121.41; 156/345; 118/723 I
(58) Field of Search ...................... 219/121.52, 121.43, 219/121.4, 121.41, 121.57; 118/723 AN, 723 I; 204/298.17, 298.02, 298.34, 298.08, 298.21, 298.32; 156/345, 646.1

(56) References Cited

U.S. PATENT DOCUMENTS

| | | |
|---|---|---|
| 4,340,462 | 7/1982 | Koch . |
| 4,612,077 | 9/1986 | Tracy et al. . |
| 4,617,079 | 10/1986 | Tracy et al. . |
| 4,948,458 | 8/1990 | Ogle . |
| 5,198,718 | 3/1993 | Davis et al. . |
| 5,234,529 | 8/1993 | Johnson . |
| 5,241,245 | 8/1993 | Barnes et al. . |
| 5,261,962 | 11/1993 | Hamamoto et al. . |
| 5,304,279 | 4/1994 | Coultas et al. . |
| 5,368,710 | 11/1994 | Chen et al. . |
| 5,401,350 | 3/1995 | Patrick et al. . |
| 5,405,480 | 4/1995 | Benzing et al. . |
| 5,688,357 | * 11/1997 | Hanawa ................................ 156/345 |
| 5,795,429 | * 8/1998 | Ishii et al. ............................ 156/345 |

FOREIGN PATENT DOCUMENTS

| | | |
|---|---|---|
| 0 517 042 A1 | 12/1992 | (EP) . |
| 0596551 | 5/1994 | (EP) . |
| 0694949 | 1/1996 | (EP) . |
| 0710055 | 5/1996 | (EP) . |
| 8-83695 | 3/1996 | (JP) . |
| 8-148476 | 6/1996 | (JP) . |

* cited by examiner

Primary Examiner—Mark Paschall
(74) Attorney, Agent, or Firm—Lowe Hauptman Gopstein Gilman & Berner

(57) ABSTRACT

A low inductance large area coil (LILAC) is provided as a source for generating a large area plasma. The LILAC comprises at least two windings which, when connected to an RF source via impedance matching circuitry, produce a circulating flow of electrons to cause a magnetic field in the plasma. Because the LILAC employs multiple windings, few turns of winding are required to obtain a large area coil, so that the inductance of the LILAC is low. The low inductance of the LILAC ensures that the self-resonating frequency of the LILAC is kept at a level far above the RF driving frequency, allowing a broad frequency range for impedance matching. Thus, there is no difficulty in impedance matching, and power transfer can be maximized, permitting efficient generation of a large area plasma.

18 Claims, 5 Drawing Sheets

LOW INDUCTANCE LARGE AREA COIL FOR AN INDUCTIVELY COUPLED PLASMA SOURCE

This application is a continuation application of Ser. No. 08/491,342 filed Jun. 30, 1995 now U.S. Pat. No. 5,874,704.

BACKGROUND OF THE INVENTION

The present invention relates generally to a low inductance large area coil for an inductively coupled plasma source. More specifically, the present invention relates to a low inductance large area coil as a source for generating a plasma which can be used for treating semiconductor wafers in low pressure processing equipment.

Plasma generation is useful in a variety of semiconductor fabrication processes, for example enhanced etching, deposition, etc. Plasmas are generally produced from a low pressure gas by inducing an electron flow which ionizes individual gas molecules through the transfer of kinetic energy through individual electron-gas molecule collisions. The electrons are commonly accelerated in an electric field, typically a radio frequency (RF) electric field.

Numerous methods have been proposed to accelerate the electrons in the RF electric field. One method is to excite electrons between a pair of opposed electrodes which are oriented parallel to the wafer in a processing chamber. The use of an electric field normal to the wafer does not provide efficient conversion of the kinetic energy to ions, since a large portion of the electron energy is dissipated through electron collisions with the walls of the processing chamber or with the semiconductor wafer itself.

A more efficient technique for exciting electrons in the RF field is to use a single winding coil (SWC) parallel to the plane of the wafer and the plasma to excite the electrons. U.S. Pat. No. 4,948,458 discloses a device for employing such a technique, which is depicted in FIGS. 1–3. As shown in FIG. 1, a plasma generating device includes an enclosure 10 with an access port 12 formed in an upper wall 14. A dielectric shield 16 is disposed below the upper wall 14 and extends across the access port 12. The dielectric shield 16 is sealed to the wall 14 to define a vacuum-tight interior of the enclosure 10. A planar single winding coil (SWC) 20 is disposed within the access port 12 adjacent the dielectric shield 16 and oriented parallel to the wafer W which is supported by a surface 22. A process gas is introduced into the chamber 18 through a port 24 formed on side of the enclosure 10.

FIG. 2 depicts schematically the plasma generating device illustrated in FIG. 1. As shown in FIGS. 1 and 2, an RF source 30 is coupled via a coaxial cable 32 through an impedance matching circuit 35 to the SWC 20. The impedance matching circuit 35 includes a primary coil 36 and a secondary loop 38 which may be positioned to adjust the effective coupling of the circuit and allow for loading of the circuit at the frequency of operation, thereby maximizing power transfer. The primary coil 36 is mounted on a disk 40 which may be rotated about a vertical axis 42 in order to adjust the coupling. A tuning capacitor 44 is provided in series with the secondary loop 38 to adjust the circuit resonant frequency to the RF driving frequency. Another capacitor 34 is provided to cancel part of the inductive reactance of the primary coil 36 in the circuit. By resonating an RF current at a resonant frequency tuned to typically 13.56 Mhz through the coil 20, a planar magnetic field is induced, which penetrates the dielectric shield 16. The magnetic field causes a circulating flow of electrons between the coil 20 and the wafer W. The circulating flow of electrons makes it less likely that the electrons will strike the enclosure wall 10 between the coil 20 and the wafer W, and since the electrons are confined to a plane parallel to the planar coil 20, the transfer of kinetic energy in non-planar directions is minimized.

Shown in detail in FIG. 3, the SWC 20 comprises a singular conductive element formed into a planar spiral or a series of concentric rings. As shown in FIGS. 1 and 3, the SWC 20 also includes a center tap labeled (+) and an outer tap labeled (−), so that it can be connected to the circuitry of the plasma generating device.

In certain applications, such as the production of 400 mm wafers or large area flat panel displays, a large area plasma is needed. In order to produce a large area plasma, the area or diameter of the SWC 20 shown in FIGS. 1–3 must be increased. For a fixed pitch between turns, the SWC 20 increases in inductance if turns are added to increase the diameter. At large diameters, the SWC 20 produces a high inductance, which reduces the self-resonating frequency of the SWC 20. As the self-resonating frequency becomes nearer the radio frequency (RF) driving frequency, which is normally 13.56 MHz, impedance matching becomes more and more difficult. This is because it is hard to exactly match impedance within a small frequency range, due to the increased sensitivity of the match condition to changes in the settings of the impedance matching components. Therefore, a difficulty arises in maximizing power transfer when using an SWC to generate a larger area plasma.

SUMMARY OF THE INVENTION

The invention provides an apparatus for generating an inductively coupled plasma, the apparatus comprising an enclosure surrounding a plasma reaction chamber bounded by a dielectric shield, an inlet in the enclosure supplying a process gas into the chamber, a coil comprising at least two electrically conductive windings disposed outside the enclosure proximate the dielectric shield, and a radio frequency source coupled to the windings via impedance matching circuitry which matches the impedance of the radio frequency source to the windings and a frequency tuning mechanism which provides resonance, the radio frequency source being effective to resonate a radio frequency current in the coil and excite the process gas into a plasma within the chamber.

According to various aspects of the invention, the coil can have different configurations. For instance, the windings can be parallel and in the same plane, the coil can be non-planar, the windings can be connected together at opposite ends thereof, the windings can be unconnected together at opposite ends thereof, the windings can be interleaved, the windings can be non-interleaved but cover different surface areas and/or the turns of one of the windings are separated by the turns of the other one of the windings. The enclosure can comprise a multiple or single wafer etching apparatus wherein a wafer chuck supports one or more semiconductor wafers having a surface to be processed parallel to the plane of the coil.

The invention also provides a method for generating an inductively coupled plasma, the method comprising the steps of introducing a process gas into a plasma reaction chamber enclosed by an enclosure bounded by a dielectric shield, and resonating a radio frequency current in a coil comprising at least two electrically conductive windings disposed outside the enclosure proximate the dielectric shield, the radio frequency current being effective to excite the process gas into a plasma within the chamber.

The method can be carried out using the various coil configurations mentioned above. Further, the plasma can be used to process one or more substrates such as semiconductor wafers or flat panel displays. For instance, a semiconductor wafer can be located in the chamber and a layer on the wafer can be etched by the plasma. During processing, the chamber can be maintained at a wide range of pressures but in a preferred embodiment the pressure is maintained below 100 mTorr.

DETAILED DESCRIPTION OF THE PREFERRED EMBODIMENTS

The present invention provides a low inductance large area coil (LILAC) with multiple windings which, when connected to an RF source, efficiently generates a large area plasma. Since the LILAC has multiple windings, fewer turns of winding are required to obtain a large diameter than if only one winding were used, as in a single-winding coil. Fewer turns of winding creates less inductance, which keeps the self-resonating frequency of the LILAC high, well above the normal 13.56 MHz RF driving frequency. The broad frequency range between the self-resonating frequency of the LILAC and the RF driving frequency enables accurate impedance matching, ensuring a maximum power transfer and an efficient generation of plasma.

According to the present invention, a low inductance large area coil (LILAC) is provided as a source for generating a large area plasma. The LILAC comprises at least two windings which, when connected to an RF source via impedance matching circuitry, produce a circulating flow of electrons to cause a magnetic field in the plasma. Because the LILAC employs multiple windings, few turns of winding are required to obtain a large area coil, so that the inductance of the LILAC is low. The low inductance of the LILAC ensures that the self-resonating frequency of the LILAC is kept at a level far above the RF driving frequency, allowing a broad frequency range for impedance matching. Thus, there is no difficulty in impedance matching, and power transfer can be maximized, permitting efficient generation of a large area plasma.

Figure 4A:
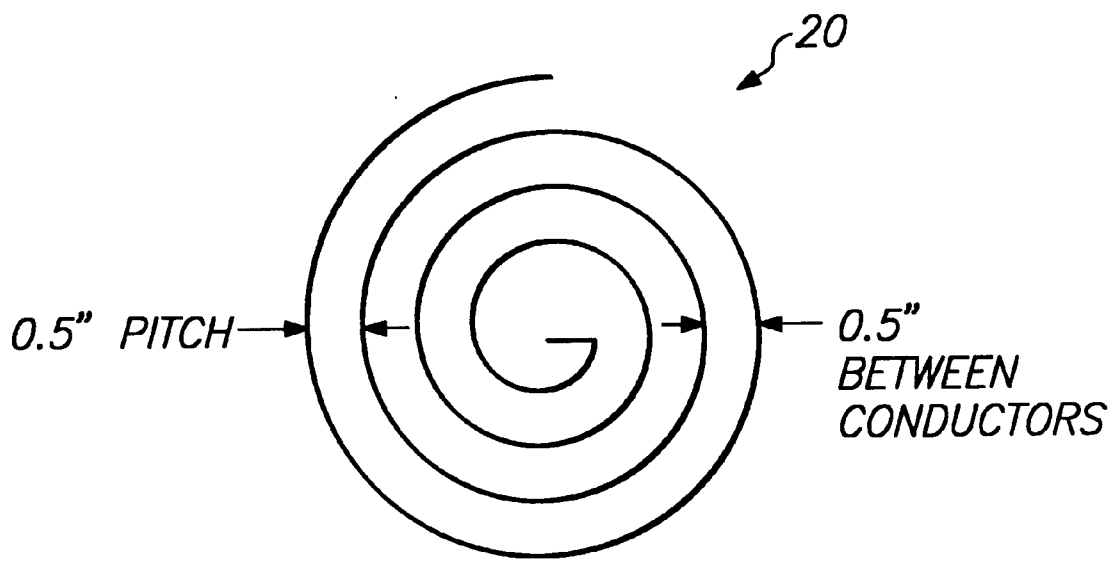
FIGS. 4A and 4B show comparisons between a conventional single winding coil and a double winding coil according to the present invention.
Figure 4B:
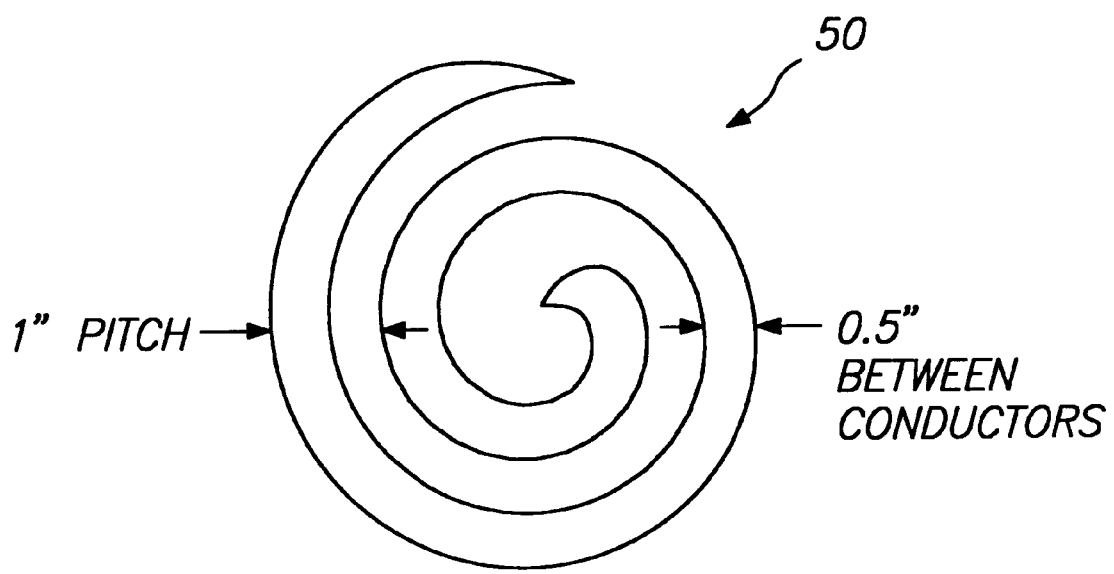

FIGS. 4A and 4B illustrate a comparison between an SWC and a LILAC with the same diameter. In FIG. 4A, the SWC 20 has four turns of winding with a pitch of 0.5 inches between conductors. The LILAC 50 in FIG. 4B has the same diameter and same interconductor spacing as the SWC 20 in FIG. 4A, but has two turns of each winding with a pitch of 1 inch. Since the LILAC 50 of the same diameter as the SWC 20 has half as many turns, the inductance of the LILAC is lower, which makes impedance matching easier at large diameters. Another reason that the LILAC inductance is low is that some or all of the windings can be electrically connected in parallel and inductances connected in parallel have a lower net inductance than the individual inductors.

Figure 5:
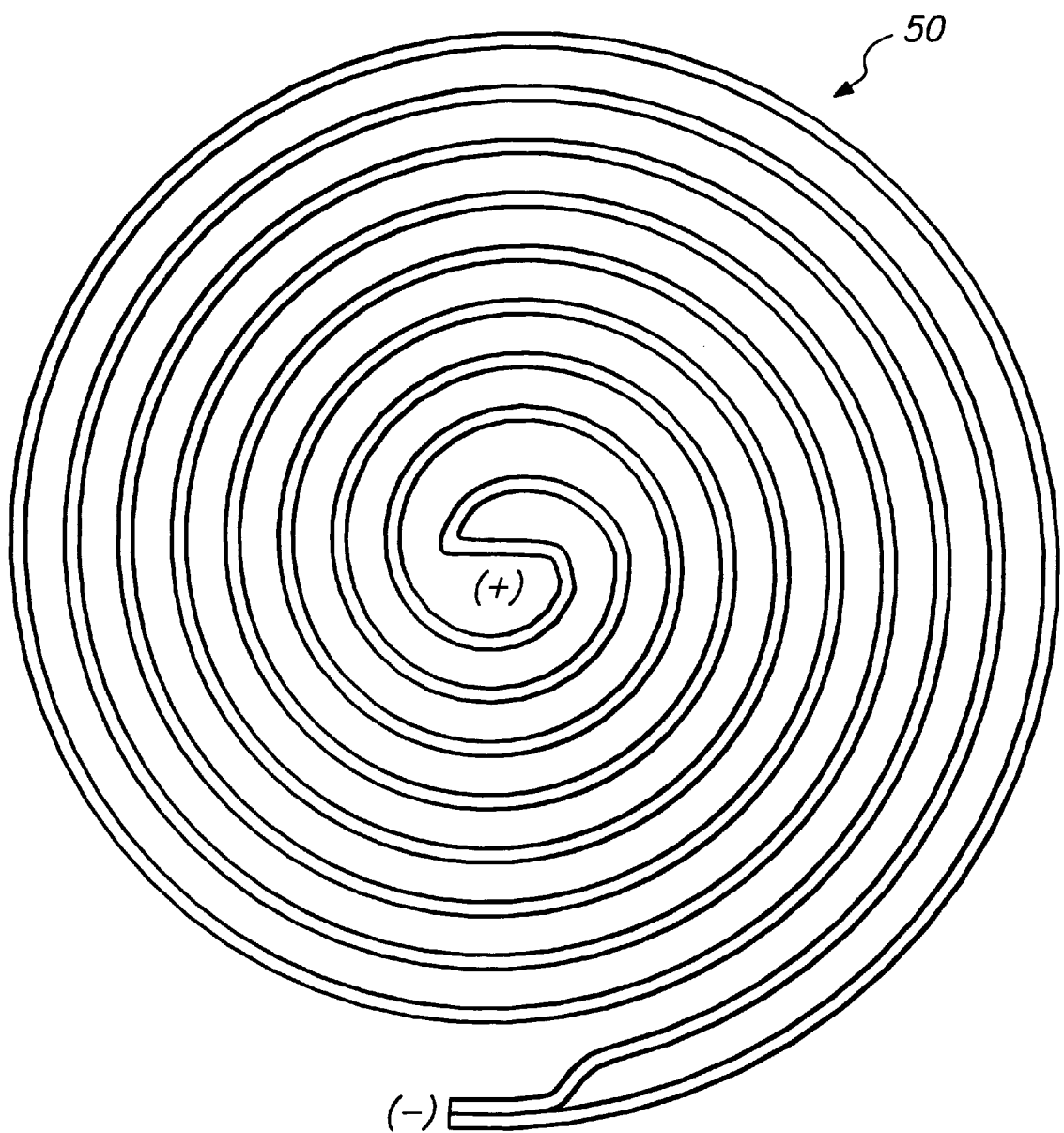
FIG. 5 depicts an interleaved double winding coil according to one embodiment of the present invention.

A simple double winding version of the LILAC is illustrated in FIG. 5. Referring to FIG. 5, the double winding LILAC 50 has a planar spiral geometry, with two windings in parallel. The pitch is doubled, relative to an SWC of the same diameter, with the windings interleaved to give a coil with about the same spacing between conductors as the SWC. The two windings are connected together at each end. A center tap (+) and an outer tap (−) facilitate connection to a plasma generating device.

Although in FIG. 5, the ends of the windings are connected, the ends of the windings do not have to be connected. One or more of the windings can be shorter than another winding and connected to that winding at some other point than the end. Alternatively, more than two interleaved windings may be used or the coil may be non-planar.

Figure 6:
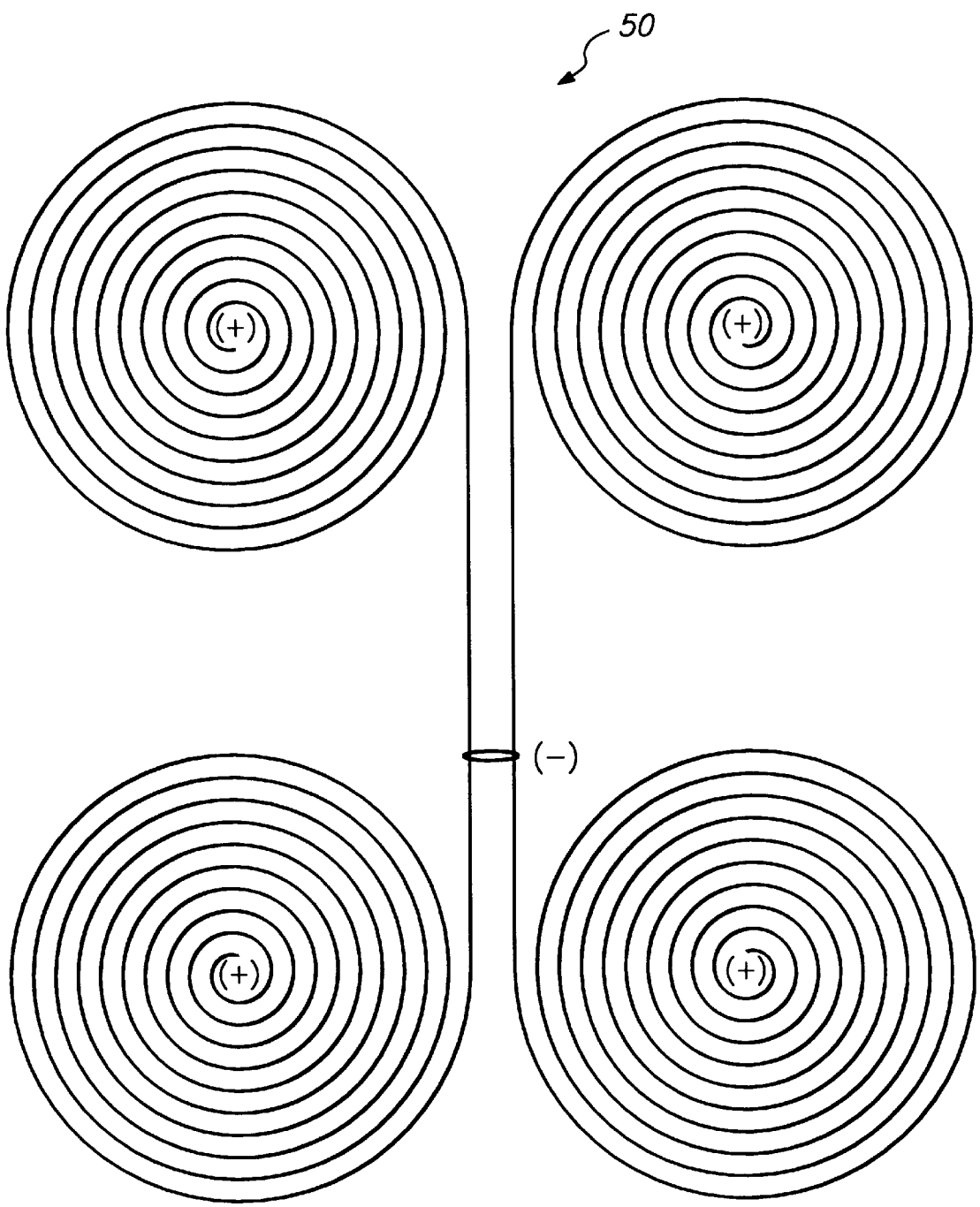
FIG. 6 depicts a non-interleaved multiple winding coil according to another embodiment of the present invention.

FIG. 6 depicts another embodiment of the LILAC, in which there are four windings, and the windings are not interleaved. The windings have (+) taps in their respective centers and there is a (−) tap where the windings meet to facilitate connection to a plasma generating device. The four windings can cover different surface areas, similar to several SWCs in parallel. A LILAC using non-interleaved multiple windings to cover an area requires fewer turns than an SWC covering the same area. Thus, the non-interleaved LILAC configuration keeps inductance low and ensures an efficient large area plasma generation.

Figure 1:
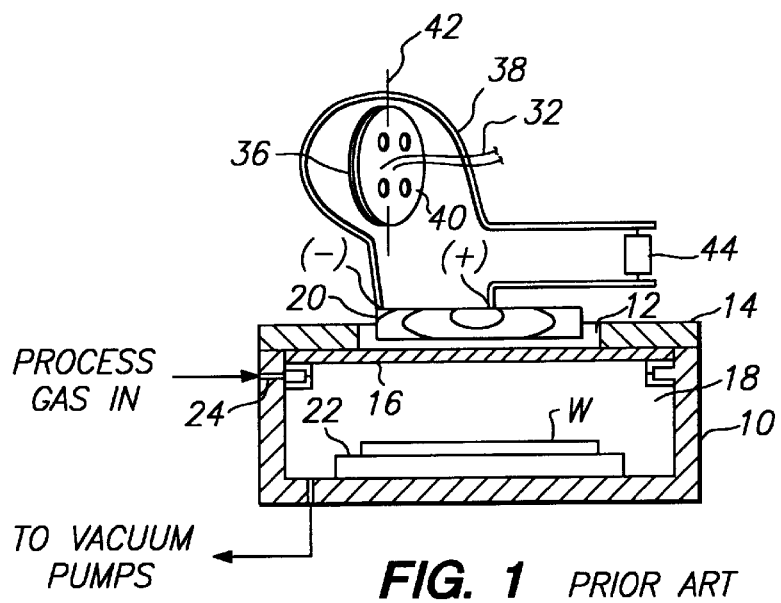
FIG. 1 depicts a plasma generating device employing a conventional single winding coil.
Figure 2:
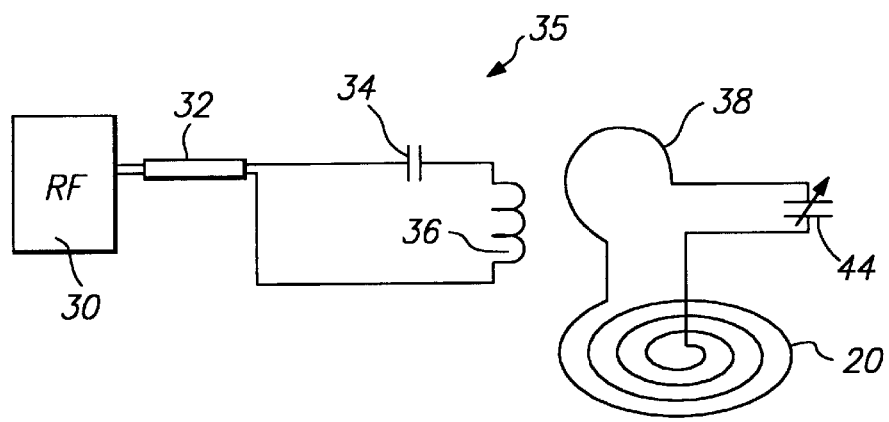
FIG. 2 illustrates schematically a plasma generating device employing a conventional single winding coil.
Figure 3:
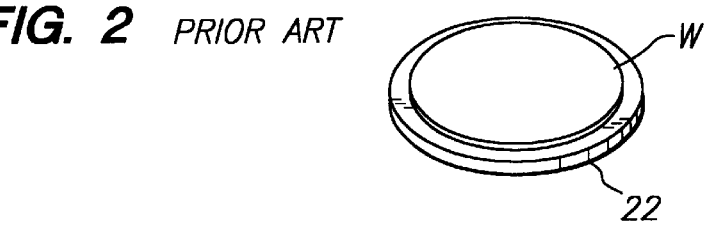
FIG. 3 illustrates in detail a conventional single winding coil.
Figure 3:
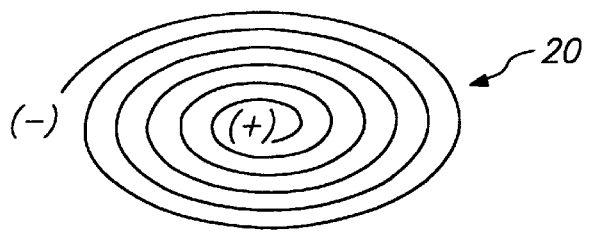
Figure 7:
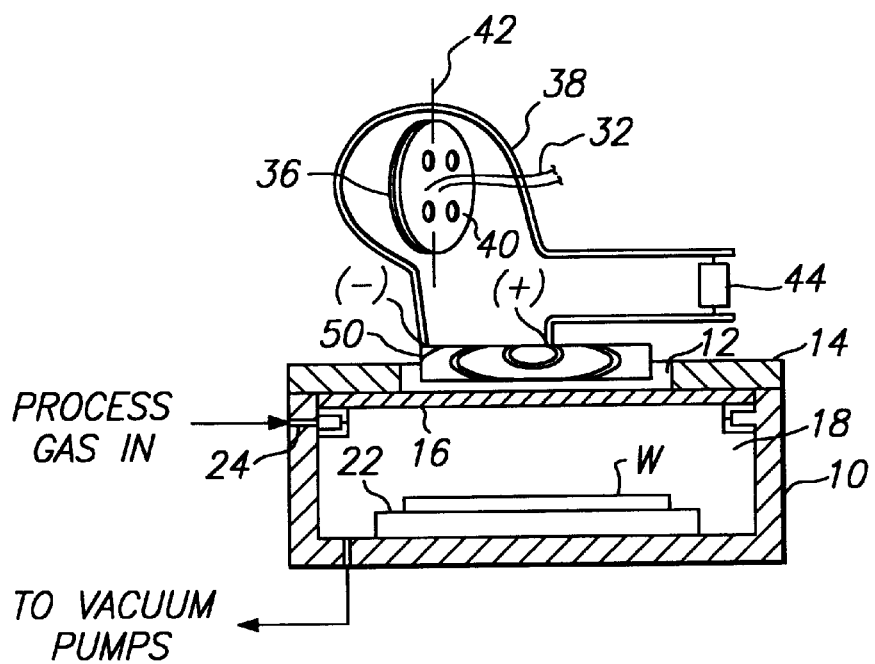
FIG. 7 depicts a plasma generating device employing a low inductance large area coil according to the present invention.
Figure 8:
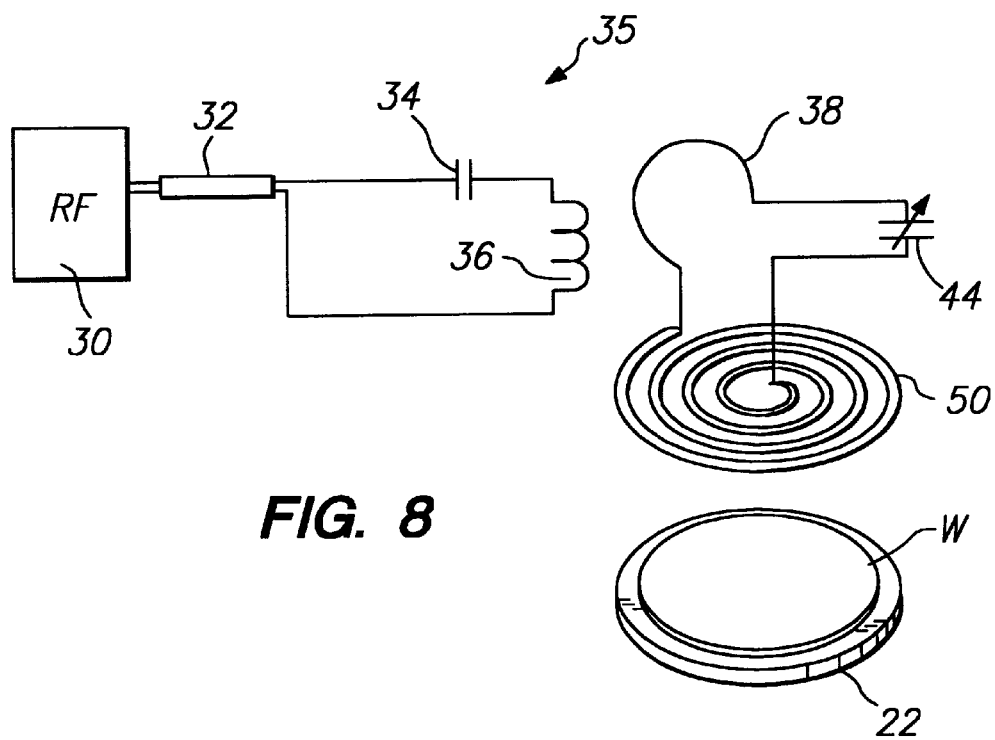
FIG. 8 illustrates schematically a plasma generating device employing a low inductance large area coil according to the present invention.

A plasma generating device employing the LILAC is depicted in FIGS. 7 and 8. The LILAC 50 may be simply powered by a single RF source 30 and an impedance matching circuit 35, like those used to power the SWC 20 as shown in FIGS. 1 and 2. Alternatively, although not illustrated, a complex LILAC design with multiple windings can employ multiple matching networks and generators.

The LILAC 50 described above permits efficient generation of a large area plasma. Although particular embodiments of the invention have been described, it will be appreciated by those of ordinary skill in the art that the present invention can be embodied in other specific forms without departing from the spirit or essential characteristics thereof. For example, although a LILAC with two or four windings has been illustrated, the number of windings is not limited thereto, but may be any number which meets the demands of large area plasma generation. Also, although the LILAC has been described as the primary coil for plasma generation, it can also be used as an auxiliary coil in conjunction with a different primary coil. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A vacuum plasma processor comprising a vacuum plasma processing chamber arranged to be responsive to a source of ionizable gas and including a workpiece holder, a coil responsive to an r.f. source for exciting the gas to a plasma capable of processing workpieces on the holder, the coil including plural windings, each of the windings including inner and outer terminals and plural turns extending radially and circumferentially between the inner and outer terminals, the r.f. source including a matching network having first and second output terminals, the matching network first output terminal being connected to the inner terminals, the matching network second output terminal being connected to the outer terminals, the connections between the matching network first and second output terminals and the inner and outer terminals of the plural windings being such that current flowing through the matching network output terminals drives the plural windings in parallel.

2. The vacuum plasma processor of claim 1 wherein the outer terminals of the plural windings have different locations in the coil, a separate lead connecting the outer terminal of each of the plural windings at the different coil locations to the matching network second output terminal.

3. The vacuum plasma processor of claim 2 wherein the coil windings are spatially displaced so that the inner terminals of the plural windings have different locations in the coil.

4. The vacuum plasma processor of claim 2 wherein each of the windings comprises a spiral like configuration.

5. The vacuum plasma processor of claim 2 wherein each of the windings has about the same length between its inner and outer terminals.

6. The vacuum plasma processor of claim 5 wherein each of the windings comprises a spiral like configuration.

7. The vacuum plasma processor of claim 1 wherein each of the windings comprises a spiral like configuration.

8. The vacuum plasma processor of claim 7 wherein each of the windings has about the same length between its inner and outer terminals.

9. The vacuum plasma processor of claim 1 wherein each of the windings has about the same length between its inner and outer terminals.

10. An excitation source for use in a vacuum processing chamber responsive to a source of ionizable gas and including a workpiece holder, the source comprising a coil having plural windings connected to be responsive to an r.f. source including a matching network having first and second output terminals, the coil being connected so it is adapted to respond to current from the source to excite the gas to a plasma capable of processing workpieces on the holder, each of the windings including inner and outer terminals and plural turns extending radially and circumferentially between the inner and outer terminals, the matching network first output terminal being connected to the inner terminals, the matching network second output terminal being connected to the outer terminals, the connections between the matching network first and second output terminals and the inner and outer terminals of the plural windings being such that current flowing through the matching network output terminals drives the plural windings in parallel.

11. The coil of claim 10 wherein the coil windings are spatially displaced so that the inner terminals of the plural windings have different locations in the coil.

12. The coil of claim 11 wherein each of the windings comprises a spiral like configuration.

13. The coil of claim 12 wherein each of the windings has about the same length between its inner and outer terminals.

14. The coil of claim 10 wherein each of the windings comprises a spiral like configuration.

15. The coil of claim 14 wherein each of the windings has about the same length between its inner and outer terminals.

16. The coil of claim 15 wherein pairs of the plural windings have segments extending radially in opposite directions away from a single location of the inner terminals.

17. The coil of claim 16 wherein the segments comprise straight lines.

18. The coil of claim 10 wherein each of the windings has about the same length between its inner and outer terminals.

* * * * *